(12) United States Patent
Khlat

(10) Patent No.: US 7,327,993 B2
(45) Date of Patent: Feb. 5, 2008

(54) LOW LEAKAGE LOCAL OSCILLATOR SYSTEM

(75) Inventor: Nadim Khlat, Cugnaux (FR)

(73) Assignee: Freescale Semiconductor, Inc., Austin, TX (US)

( * ) Notice: Subject to any disclaimer, the term of this patent is extended or adjusted under 35 U.S.C. 154(b) by 359 days.

(21) Appl. No.: 10/481,977

(22) PCT Filed: Jun. 3, 2002

(86) PCT No.: PCT/EP02/06073

§ 371 (c)(1),
(2), (4) Date: Feb. 10, 2005

(87) PCT Pub. No.: WO03/001692

PCT Pub. Date: Jan. 3, 2003

(65) Prior Publication Data

US 2005/0118973 A1    Jun. 2, 2005

(30) Foreign Application Priority Data

Jun. 25, 2001   (EP) ................................. 01401670

(51) Int. Cl.
  *H04B 1/06* (2006.01)
  *H04B 1/16* (2006.01)
  *H03L 7/00* (2006.01)

(52) U.S. Cl. .................... 455/265; 331/34; 455/217

(58) Field of Classification Search ................ 455/255, 455/256, 257, 259, 260, 264, 265, 317–319; 331/34

See application file for complete search history.

(56) References Cited

U.S. PATENT DOCUMENTS 5,140,703 A    8/1992  Payne
5,530,929 A    6/1996  Lindqvist et al.
6,298,106 B1 * 10/2001 Hernandez Gamazo et al. ............... 375/376
6,308,055 B1 * 10/2001 Welland et al. ............. 455/260

FOREIGN PATENT DOCUMENTS

JP    11331011    11/1999
WO    WO 00/31885    6/2000

OTHER PUBLICATIONS

PCT Search Report PCT/EP02/06073 mailed Jun. 24, 2003.

* cited by examiner

*Primary Examiner*—Duc M. Nguyen
*Assistant Examiner*—Michael Thier

(57) ABSTRACT

Local oscillator apparatus comprising communication signal terminals for a communication signal, especially in a receiver or a transmitter, and a controlled frequency oscillator for producing a local oscillator signal. The local oscillator also includes a reference frequency generator and a feedback loop for selecting and adjusting the frequency of the local oscillator signal relative to the frequency of said reference frequency signal. A first frequency divider divides the frequency of the local oscillator signal by a first division factor to produce a conversion signal, where the frequency of said conversion signal is at least approximately equal to the frequency of the communication signal, and conversion means responsive to the conversion signal converts between said communication signal and base-band signal. A second frequency divider divides the frequency of the local oscillator signal by a second division factor and is connected in the feedback loop, where the division factor is different to the second division factor and the ratios between said first and second division factors are fractional.

13 Claims, 3 Drawing Sheets

LOW LEAKAGE LOCAL OSCILLATOR SYSTEM

FIELD OF THE INVENTION

This invention relates to low leakage local oscillator apparatus and to a communications system including such apparatus. The invention is particularly, but not exclusively, applicable to in communications apparatus in which the communications signal is combined with a signal derived from the local oscillator.

BACKGROUND OF THE INVENTION

Local oscillators are used in various electronic circuits to generate a signal to be combined with a communication signal. Such is the case, for example, in direct-conversion receivers and transmitters, in which the communication signal is converted in a single step between communications frequency and base-band frequency. In the case of a radio receiver, a radio signal received may be directly down converted to In-phase (I) and Quadrature-phase (Q) signals and, in the case of a radio transmitter, a radio signal to be transmitted may be directly up converted from In-phase (I) and Quadrature-phase (Q) signals. Such direct-conversion receivers and transmitters enable a high degree of integration of the circuits, for example by avoiding the need for band-pass filters, as are required in heterodyne receivers and transmitters.

It is important to minimise the effect of spurious signals also being combined with the communication signal, such spurious signals appearing as a consequence of 'leakage', the propagation of unwanted, parasitic signals generated by the local oscillator and other circuits in the communications apparatus.

A direct-conversion receiver is described in U.S. Pat. No. 5,530,929, including a local oscillator that is connected to a first processing unit that multiplies the output frequency of the local oscillator by a factor M. The first processing unit is operatively connected to a second processing unit in which the output signal of the first processing unit is divided by a factor N. M and N are both integer numbers and examples are given with M=3 and N=2 and with M=2 and N=3. The output signal from the second processing unit is supplied to I and Q mixers where it performs a homodyne conversion to base-band of the incoming RF communication signal, at least the second processing unit being integrated with the mixers to reduce propagation of spurious signals.

SUMMARY OF THE INVENTION

The present invention provides local oscillator apparatus, receiver apparatus and transmitter apparatus as claimed in the claims herebelow.

The invention is applicable to radio receivers and transmitters and also to other communication systems, such as cable communication systems involving use of low leakage local oscillators.

DETAILED DESCRIPTION OF THE PREFERRED EMBODIMENTS

Figure 1:
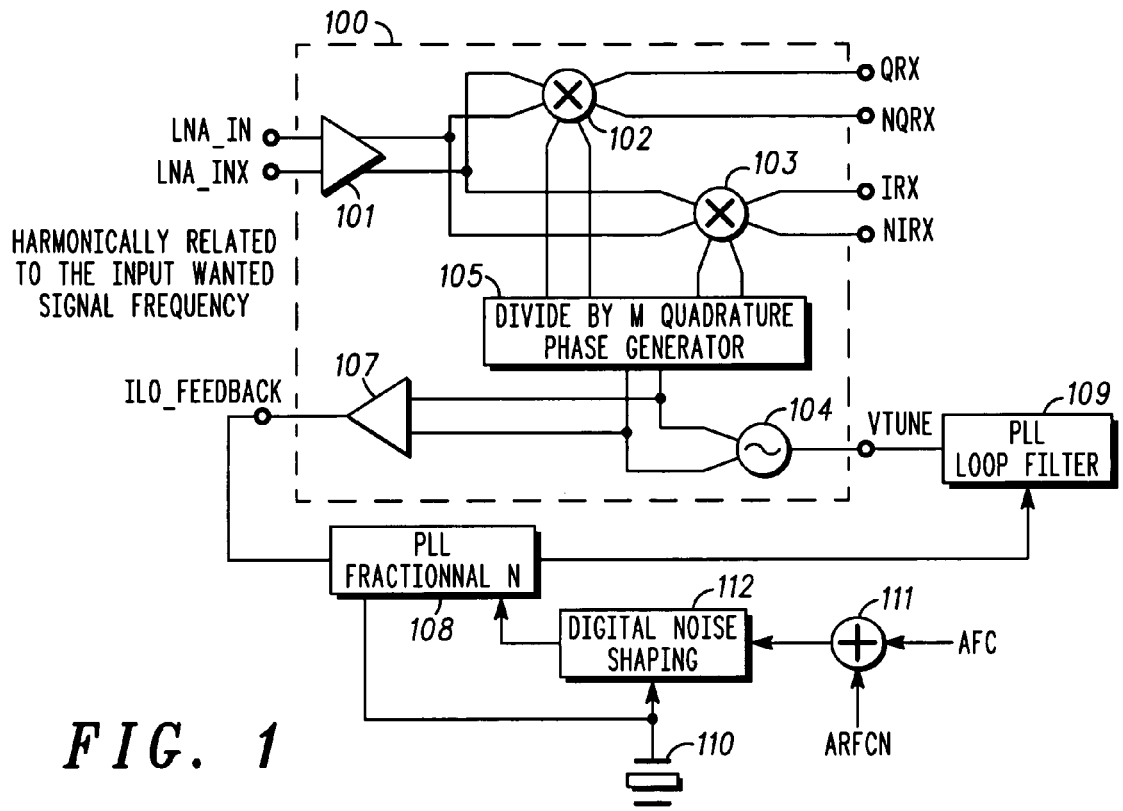
FIG. 1 is a block schematic diagram of a radio receiver not using the present invention.

The communications apparatus shown in the drawings are direct (or pseudo-direct) conversion receivers (or transmitters) that immediately down convert (up convert) the received radio signal (the transmit radio signal) to (from) a base-band signal thus completely eliminating any intermediate frequency IF stage (as would be found in a heterodyne receiver or transmitter). However, prior art receivers of this kind have suffered from the formation of a very large unwanted dc component interfering with the base-band signal. This dc component is formed largely by leakage from the local oscillator being received (or transmitted) at the receiver (at the transmitter) aerial together with the wanted signal, and also by offsets of the amplifiers and mixers in the receivers.

In order to overcome this problem, the frequency fVCO of the signal generated by the Voltage Controlled Oscillator (RF VCO) and mixed with the communication signal is a multiple M of the communication radio frequency. The multiple M is preferably an even number which simplifies the generation of I and Q components with a phase difference of 900 from a common signal and is preferably 4 times or 2 times, so as to limit the frequency of the voltage controlled oscillator.

Referring to FIG. 1, the direct conversion receiver shown, which does not incorporate the present invention, comprises an integrated circuit 100 having differential input terminals LNA_IN and LNA_INX for receiving the RF communication signal at a frequency of fRF, differential quadrature output terminals IRX, NIRX and QRX, NQRX for output of the base-band communication signal after conversion, a phase-locked loop (PLL) feedback output terminal fLO_feedback and an input terminal VTUNE for tuning voltage signal of the PLL.

The integrated circuit 100 includes a low noise amplifier whose inputs are connected to the differential input terminals LNA_IN and LNA_INX and whose differential outputs are connected to the inputs of Q and I mixers 102 and 103. The differential outputs of the mixers are connected to the differential quadrature output terminals IRX, NIRX and QRX, NQRX. The integrated circuit 100 also includes a voltage controlled oscillator 104 whose RF frequency fVCO is tuned by the voltage appearing at the input terminal VTUNE. The differential outputs of the voltage controlled oscillator 104 are connected to the inputs of an I/Q frequency divider circuit 105 which generates quadrature signals ILO+, ILO− and QLO+, QLO− at a frequency FILO equal to fVCO/M, where M is an integer. The I/Q frequency divider circuit 105 does not need to include phase shift components if the frequency division factor M is an even number.

The differential Q and I outputs of the I/Q frequency divider circuit 105 are connected to the inputs of the respective mixers 102 and 103. The differential outputs of the voltage controlled oscillator 104 are also connected to the inputs of a buffer amplifier 107, which produces a simple output signal, its output being connected to the feedback output terminal fLO_feedback.

The above elements are all included in the integrated circuit 100. However the receiver also includes a feedback loop, external to the integrated circuit 100. The feedback loop comprises a phase-lock loop circuit 108 of the fractional-N kind capable of dividing a reference frequency by a selected fractional number, that is to say a number that may be a non-integer. Output frequency step sizes that are fractions of the reference signal frequency are obtained while maintaining a high reference frequency and wide loop bandwidth. Suitable fractional-N phase lock loops may be found in U.S. Pat. Nos. 5,166,642 and 5,530,929 (Hietala et al., assigned to the assignee of the present invention). The fact that the phase-lock loop is on a separate substrate avoids direct leakage to sensitive elements of the receiver such as the low noise amplifiers.

The phase-lock loop circuit 108 has one input connected to the feedback output terminal fLO_feedback and an output connected to a low pass filter 109. A crystal controlled oscillator 110 generates a frequency reference signal at a fixed reference frequency fxtal, its output being connected to another input of the phase-lock loop circuit 108. A digital adder circuit 111 receives a digital frequency correction word AFC and adds it to a digital RF channel number selection signal ARFCN. The output of the adder circuit is connected to a digital fractionalisation and noise-shaping circuit 112 to select the internal fractional number of the phase lock loop that defines the ratio of the desired frequency to the reference frequency fxtal supplied by the crystal controlled oscillator 110 to its input; the output of the digital fractionalisation and noise-shaping circuit 112 is connected to yet another input of the phase-lock loop circuit 108.

In operation of the receiver shown in FIG. 1, the phase-lock loop circuit 108 compares the phase of the signal at the feedback output terminal fLO_feedback, which is at the actual frequency fVCO of the voltage controlled oscillator 104, with the desired frequency obtained by dividing the reference frequency fxtal by the selected internal fractional number of the phase-lock loop, with fine tuning capability. The voltage produced by the result of the comparison, filtered by the filter 109, controls the frequency of the voltage controlled oscillator 104 to the desired frequency.

In the receiver of FIG. 1, the frequency of the signal at the feedback terminal fLO_feedback=fvCO=fRF/M (where preferably M=4 or 2).

The phase-lock loop is external to the integrated circuit 100 and generates only low levels of spurious signals, which can be kept separate to a large extent from the communication signal. However the local oscillator feedback signal is routed from one integrated circuit to another, at the feedback output terminal fLO_feedback and some local oscillator leakage can still propagate to the input terminals LNA_IN and LNA_INX due to limited isolation that would be present within the RF integrated circuit 100 which at the current state of the art is measured to −50 dB in the 2 Ghz frequency range.

So the input of the low noise amplifier 101 will see a leakage signal at a frequency equal to fVCO and then this leakage signal (LO leakage) will mix also with the frequencies of the outputs of the divider M 105 which are all harmonics of fVCO/M.

The Mth harmonics of fVCO/M at the divider outputs will mix with the fLO_feedback resulting in a low DC offset (even if this Mth harmonic is small due to differential strucutre), that is measured in current technology to −95 dbm (reference IEEE 2001. "WBCDMA Zero-IF Front-End for UMTS in a 75 Ghz Sige BiCMOS Technology", authors: Harald Pretl, . . . ).

So fLO_feedback(LO leakage)=fVCO=fRF*M(LO leakage harmonically related to the input wanted frequency).

$$FILO = x*fVCO/M = x*fRF$$

So for x=M, this results in a DC offset output.

Also, fLO_feedback (LO leakage) can also generate sub-harmonic signals due to the shape of the signal LO_feedback which falls to the input RF frequency.

Thus the amount of leakage frequency located at the same frequency as the input received signal is not completely eliminated and can be measured at a level higher than the lowest wanted signal to be received.

Figure 2:
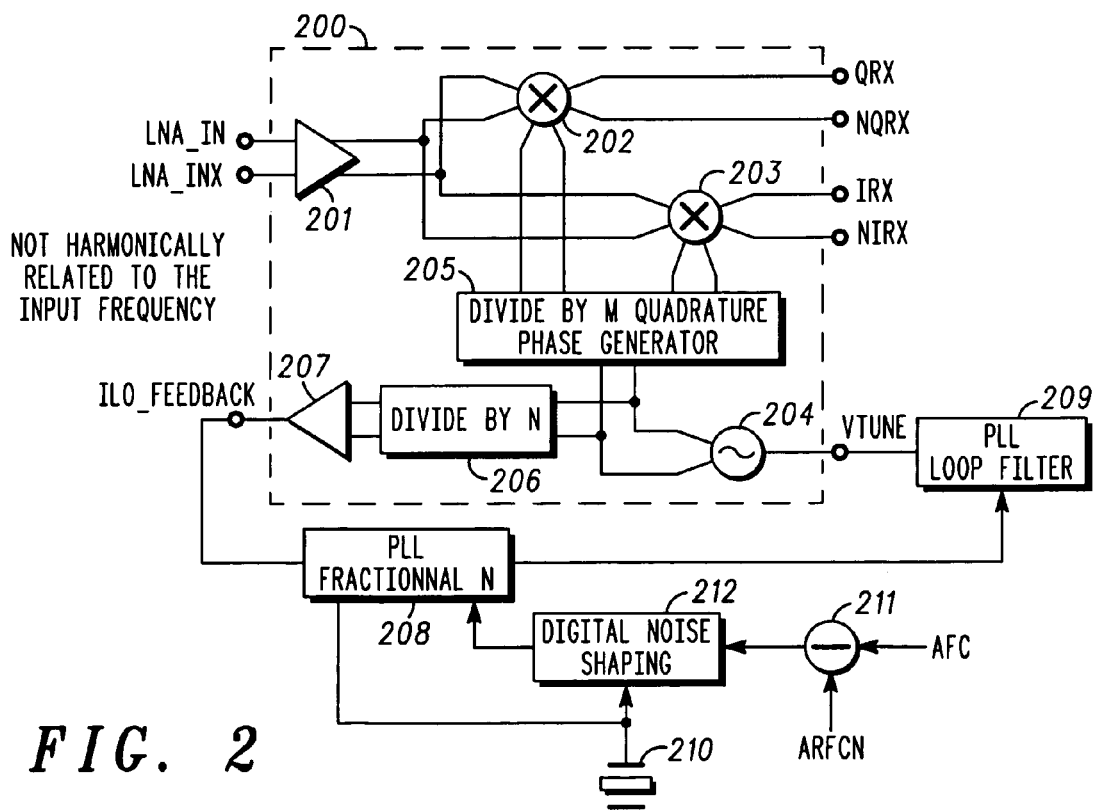
FIG. 2 is a block schematic diagram of a radio receiver in accordance with one embodiment of the invention.

Referring to FIG. 2, this shows a block diagram of a direct conversion receiver in accordance with the present invention; it will be appreciated that the invention is also applicable to a pseudo direct conversion receiver. Similar elements in FIG. 2 bear the same reference numbers as the corresponding elements of FIG. 1 but increased by 100, the integrated circuit 100 of FIG. 1 becoming the integrated circuit 200 of FIG. 2, and so on.

In addition to the elements of the receiver shown in FIG. 1, the receiver of FIG. 2 also includes a fixed divider 206 whose differential inputs are connected to the outputs of the I/Q voltage controlled oscillator 204 and whose differential outputs are connected to the inputs of the buffer amplifier 207, so that the divider 206 is connected in series in the feedback loop and divides the frequency fVCO of the voltage controlled oscillator 204 by a factor N.

The factor N is chosen so that the frequency of the LO feedback signal appearing at the feedback output terminal fLO_feedback is not harmonically related to the input wanted frequency fRF.

$$fLO\_feedback(LO\ leakage) = fVCO/N$$

$$fRF(\text{input wanted frequency}) = fVCO/M$$

$$fLO\_feedback = M/N*fRF$$

N is chosen to be different to M and the ratios M/N and N/M are chosen to be fractional (that is to say non-integers). Preferably M is an even number, if only to facilitate the generation of quadrature signals, as mentioned above.

If M is an even number, N is preferably an odd number greater than 1 or a multiple of an odd number greater than 1. If M=2*p, then N is preferably chosen equal to 2*p+1 or 2*p−1 such that $$FLO\_feedback = 2*p/(2*p+1)*fRF\ or\ 2*p/(2*p-1)*fRF$$

This relationship ensures that the LO leakage is not harmonically related to the input wanted frequency fRF, thus further reducing the effect of the LO leakage on the wanted signal (i.e the generated DC offset at the mixer outputs (202 and 203) and it is possible to reduce the leakage to a level lower than −120 dbm without any shielding.

In preferred but non-limitative examples of this embodiment of the invention, p=1, M=2, N=3 (N=1 is not selected on this case only since this make the LO-feedback harmonically related.)
or
p=2, M=4, N=5 or N=3 or
p=4, M=8, N=7 or N=9.

The GSM (Global System for Mobile communications) standards or WBCDMA (Wide Band Code Division Multiple Access) standards of the European Telecommunications Standards Institute (ETSI) have channel steps of 200 khz. Since the fLO_feedback=M/N*fRF, in the case of the present embodiments of this invention, this results in a requirement for frequency steps of M/N*200 khz to be done by the phase locked loop, which is a fractional number of 200 khz. The use of the fractional-N phase-lock loop in conjunction with the frequency divider 206 dividing by N enables this to be achieved with extremely low leakage levels.

Note also that the use of a divider by N rather than a multiplier (as in U.S. Pat. No. 5,530,929 referred to above) creates substantially less phase noise since multipliers multiply the phase noise of the voltage controlled oscillator.

Figure 3:
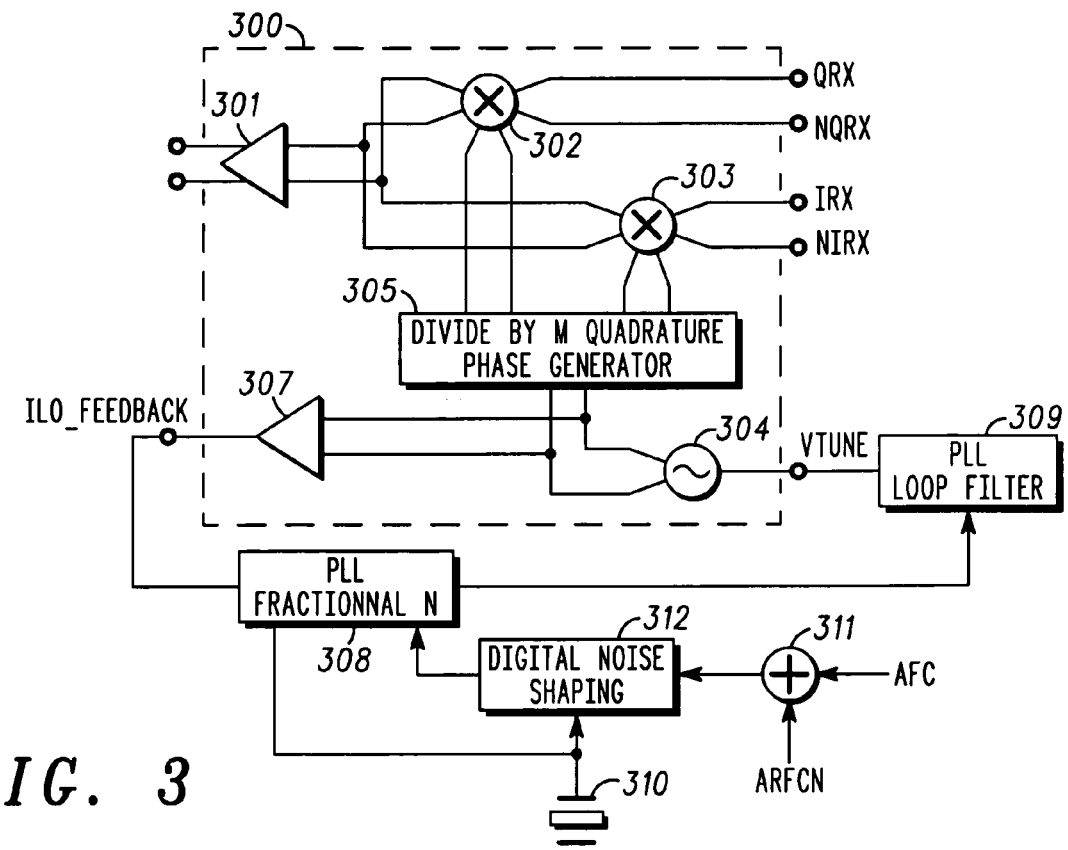
FIG. 3 is a block schematic diagram of a radio transmitter not using the present invention.

Referring to FIG. 3, this shows a block diagram of a direct conversion transmitter which is not in accordance with the present invention. Similar elements in FIG. 3 bear the same reference numbers as the corresponding elements of FIG. 1 but increased by 200, the integrated circuit 100 of FIG. 1 becoming the integrated circuit 300 of FIG. 3, and so on.

An output radio frequency signal to be transmitted at frequency fRF is processed by a voltage gain attenuator (VGA) 301 driven from a quadrature pair of mixers 302 and 303. The quadrature pair of mixers 302 and 303 have as inputs the base-band signal and the conversion signals ILO+,ILO− and QLO+,QLO− derived from the integrated RF VCO 304 frequency fVCO by a frequency divider 305 dividing by M. M is again preferably equal to 4 (or 2) to facilitate deriving the quadrature oscillator injection signals ILO+,ILO− ana QLO+,QLO.

A phase-lock loop PLL 308 that is of the fractional-N kind is used to control the integrated voltage controlled oscillator 304, by comparing the LO feedback signal derived from the buffer output stage 307 to the radio reference crystal clock 310.

Since the phase-lock loop 308 is fractional with fine tuning capability and has internally the pre-scaler divider stage, the digital correction frequency word AFC is added to the selected channel to be transmitted ARFCN and used as reference word to the digital fractionalisation block 312 to derive control words for the fractional N phase-lock loop 308.

In the transmitter circuit shown in FIG. 3, the frequency fLO_feedback=fvCO=fRF/M where M=4 or 2.

Spurious signals originating from the terminals fLO_ Feedback will radiate to the VGA output (301) due to limited isolation that would be present within the RF IC (300) which at the current technology art is measured to −50 dB at 2 Ghz frequency range.

So the frequency fLO_feedback(LO leakage)=fVCO= fRF*M (LO leakage harmonically related to the output wanted frequency).

Also, the frequency fLO_feedback (LO leakage) can also generate sub-harmonic signals due to the shape of LO_feedback signal which falls to the output RF frequency. This results in a spurious signal falling at the same frequency as the wanted transmit frequency which will distort the transmit signal and increase the Error Vector Modulation (EVM) by offsetting the modulation from an ideal modulation, especially when the wanted transmit signal level is reduced due to power control requirements done on the VGA (301), whereas the LO leakage level is not reduced, the LO leakage level thus increasing relative to the wanted transmit frequency level.

Figure 4:
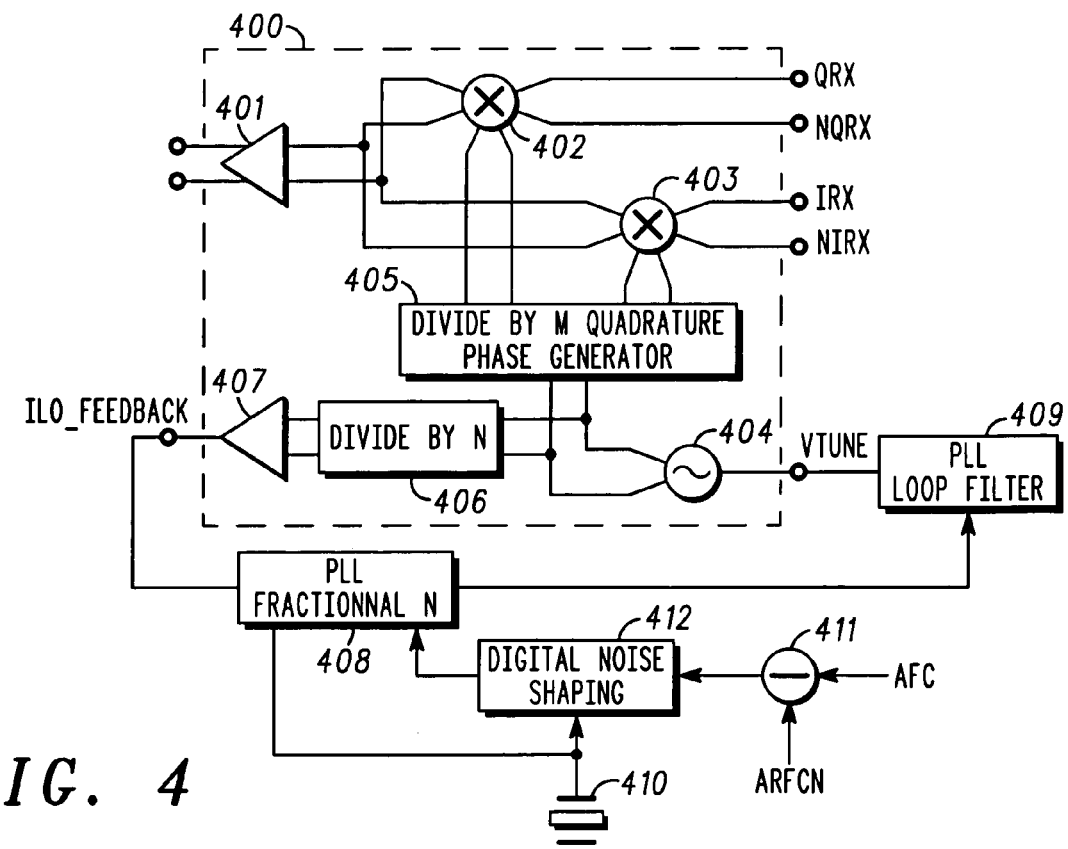
FIG. 4 is a block schematic diagram of a radio transmitter in accordance with another embodiment of the invention.

FIG. 4 shows a block diagram of a direct conversion transmitter in accordance with the present invention. Similar elements in FIG. 4 bear the same reference numbers as the corresponding elements of FIG. 3 but increased by 100, the integrated circuit 300 of FIG. 3 becoming the integrated circuit 400 of FIG. 4, and so on.

In addition to the elements of the transmitter shown in FIG. 3, the transmitter of FIG. 4 also includes a fixed divider 406 whose differential inputs are connected to the outputs of the I/Q voltage controlled oscillator 404 and whose differential outputs are connected to the inputs of the buffer amplifier 407, so that the divider 406 is connected in series in the feedback loop and divides the frequency fVCO of the voltage controlled oscillator 404 by a factor N.

The factor N is chosen so that the frequency of the LO feedback signal appearing at the feedback output terminal fLO_feedback is not harmonically related to the input wanted frequency fRF.

$$fLO\_feedback(LO\ leakage)=fVCO/N$$

$$fRF(input\ wanted\ frequency)=fVCO/M$$

$$fLO\_feedback=M/N*fRF$$

N is chosen to be different to M and the ratios M/N and N/M are chosen to be fractional (that is to say non-integers). Preferably M is an even number, if only to facilitate the generation of quadrature signals, as mentioned above.

If M is an even number, N is preferably an odd number greater than 1 or a multiple of an odd number greater than 1. If M=2*p, then N is preferably chosen equal to 2*p+1 or 2*p−1 such that $$FLO\_feedback=2*p/(2*p+1)* fRF\ or\ 2*p/(2*p-1)*fRF$$

This relationship ensures that the LO leakage is not harmonically related to the output transmitter frequency fRF, thus further reducing the effect of the LO leakage on the transmitted communication signal.

In preferred but non-limitative examples of this embodiment of the invention, p=1, M=2, N=3 (N=1 is not selected on this case only since this make the LO-feedback harmonically related.) or p=2, M=4, N=5 or N=3 or p=4, M=8, N=7 or N=9.

Since the fLO_feedback=M/N*fRF, for a channel step of 200 khz like in GSM or WBCDMA, this results in M/N*200 khz frequency step to be done by the phase locked loop, which is a fractional number of 200 khz. The use of the fractional-N phase-lock loop in conjunction with the frequency divider 206 dividing by N enables this to be achieved with extremely low leakage levels.

In the case of a multi-standard transmitter/receiver, the selection of N=2*p−1 or 2*p+1 depends on the presence of several radios within the terminal unit and the selection of 2p−1 or 2p+1 is done such a way that no frequency is created that could block a received signal.

For example, in the case of a terminal including a WBCDMA transmitter and a GPS receiver (GPS is the Global Positioning System managed by the Interagency GPS Executive Board (IGEB) established by the USA government), it is preferable to select N=3 rather N=5 to avoid creating an LO feedback frequency that falls at almost the same received frequency of GPS (1575 Mhz).

| WBCDMA IMT2000 | | fTX 1920-1980 Mhz | fRX 2110-2170 Mhz | | | |
|---|---|---|---|---|---|---|
| | | fTX (WBCDMA) | fLO (WBCDMA) | 2*fLO | 3*fLO | 4*fLO |
| M (VCO mixer divider) | 2 | 1920 | 768 | 1536 | 2304 | 3072 |
| N (VCO LO divider) | 5 | 1930 | 772 | 1544 | 2316 | 3088 |
| | | 1940 | 776 | 1552 | 2328 | 3104 |
| | | 1950 | 780 | 1560 | 2340 | 3120 |
| | | 1960 | 784 | 1568 | 2352 | 3136 |
| | | 1970 | 788 | 1576 | 2364 | 3152 |
| | | 1980 | 792 | 1584 | 2376 | 3168 |

*Spurs Blocking for GPS

| WBCDMA IMT2000 | | fTX 1920-1980 Mhz | fRX 2110-2170 Mhz | | | |
|---|---|---|---|---|---|---|
| | | fTX (WBCDMA) | fLO (WBCDMA) | 2*fLO | 3*fLO | 4*fLO |
| M (VCO mixer divider) | 2 | 1920 | 1280 | 2560 | 3840 | 5120 |
| N (VCO LO divider) | 3 | 1930 | 1286, 667 | 2573, 333 | 3860 | 5146, 667 |
| | | 1940 | 1293, 333 | 2586, 667 | 3880 | 5173, 333 |
| | | 1950 | 1300 | 2600 | 3900 | 5200 |
| | | 1960 | 1306, 667 | 2613, 333 | 3920 | 5226, 667 |
| | | 1970 | 1313, 333 | 2626, 667 | 3940 | 5253, 333 |
| | | 1980 | 1320 | 2640 | 3960 | 5280 |

It will be understood that the phase-lock loops are separate from the integrated circuit that includes the input or output terminals LNA_IN, LNA_INX; RF_OUT, RF_OUTN, the voltage controlled oscillators 204; 404, the frequency dividers 205; 405, the mixers 202, 203; 402, 403 and the low noise amplifiers or voltage gain attenuators 201; 401 enables circuits that would be liable to propagate spurious signals within the integrated circuit, such as the digital noise shaping circuits 212; 412 to be used without spurious signals propagating to the low level low noise circuits like low noise amplifiers (LNA) and down-converted mixers (or up-converted mixers and voltage gain attenuators (VGA) for transmitters).

As the fractional-N phase-lock loops are external to the RF Integrated circuits, the local oscillator feedback signal is routed from one IC to another IC. With circuits of the kind shown in FIG. 1 or FIG. 3, which are not in accordance with the present invention, the residual local oscillator leakage would still be sufficiently high to require shielding, which is inconvenient and costly and not always sufficiently effective. The present invention enables satisfactorily low leakage levels to be achieved without the need for shielding, especially in this type of direct conversion receiver and transmitter.

Figure 5:
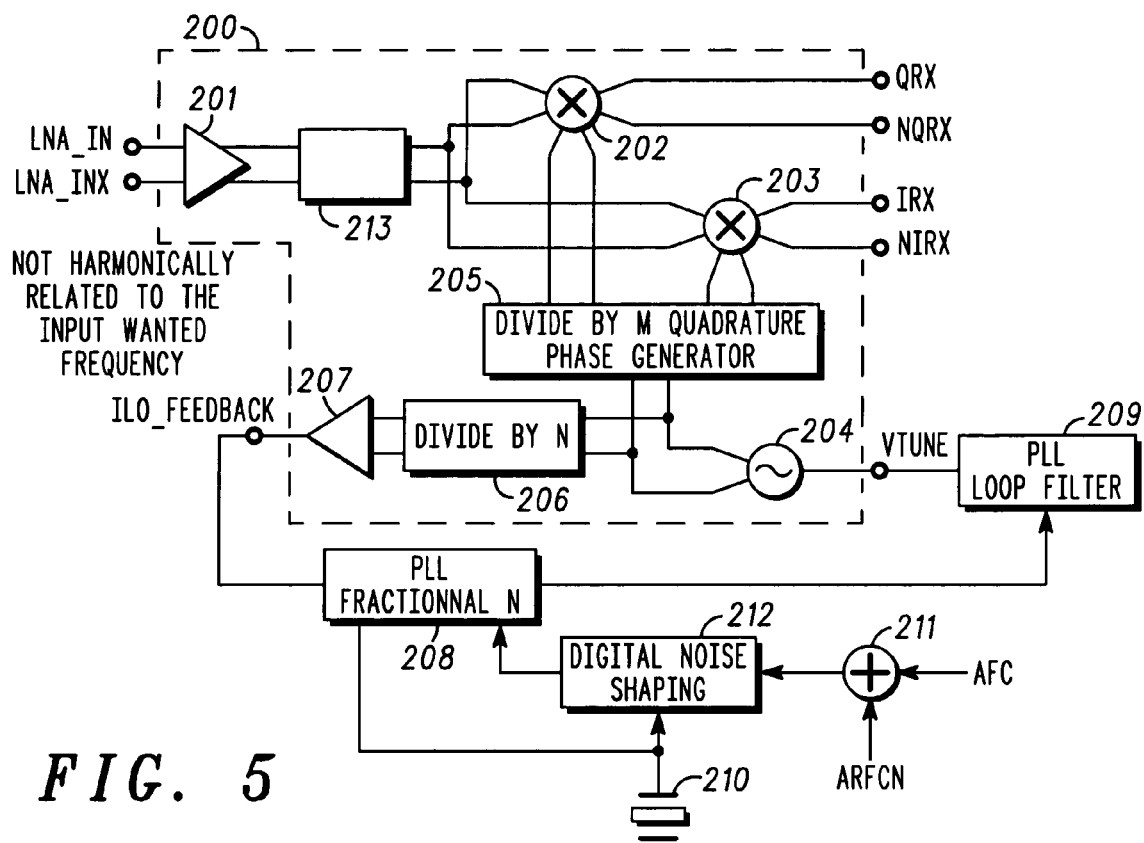
FIG. 5 is a block schematic diagram of a radio receiver in accordance with yet another embodiment of the invention.

FIG. 5 shows an advantageous variant of the receiver shown in FIG. 5. Similar elements in FIG. 5 bear the same reference numbers as the corresponding elements of FIG. 2.

In addition to the elements of the receiver shown in FIG. 2, the receiver of FIG. 5 also includes a transformer 213 comprising a first coil connected to the outputs of the low noise amplifier 201 and a second coil, inductively coupled to the first coil and connected to the inputs of the mixers 202 and 203. The inductances and internal capacitances of the coils of the transformer form a circuit tuned to the frequency fRF of the communication signal so as to form a so-called 'balun'.

In operation, the transformer 213 performs an impedance transformation between the low noise amplifier 201 and the mixers 202 and 203. It additionally acts as a band-pass filter to filter out of band blockers (or unwanted signals). In particular, the transformer will filter the LO leakage harmonics, for example the 5$^{th}$ harmonics of the residual LO leakage. With the frequency fVCO at 4 Ghz, the frequency fLO_feedback=800 Mhz, and the frequency of the 5$^{th}$ harmonic=5*800=4 Ghz. The wanted signal is at 1 Ghz, so the 5$^{th}$ harmonics will be out of the pass-band of the transformer and will be attenuated before mixing could result in low frequency (DC) offsets.

While the above embodiments of the invention have been described with reference to receivers or transmitters, it will be understood that frequently a terminal will include both a receiver and a transmitter, which may be arranged to have elements in common. Such will normally be the case for a portable telephone handset, for example.

The invention claimed is:

1. Local oscillator apparatus comprising:
   communication signal terminals for a communication signal, controlled frequency oscillator means for producing a local oscillator signal, reference frequency means for producing a reference frequency signal, feedback loop means for selecting and adjusting the frequency of said local oscillator signal relative to the frequency of said reference frequency signal, said feedback loop means including fractional-number dividing means for dividing said reference frequency by a programmable fractional number and supplying a feedback signal to control the frequency of said oscillator means, first frequency divider means for dividing the frequency of said local oscillator signal by a first division factor to produce a conversion signal, where the frequency of said conversion signal is at least approximately equal to the frequency of said communication signal, and conversion means responsive to said conversion signal for converting between said communication signal and a base-band signal, characterised in that second frequency divider means for dividing the frequency of said local oscillator signal by a second division factor is connected in said feedback loop means between said controlled frequency oscillator means and said fractional-number dividing means so that said fractional-number dividing means is responsive to the relative values of said reference frequency divided by said programmable fractional number and said frequency of said local oscillator signal divided by said second division factor, where the first division factor is different to the second division factor and the ratios between said first and second division factors are fractional.

2. Local oscillator apparatus as claimed in claim 1, characterised in that said first and second division factors are integers greater than 1.

3. Local oscillator apparatus as claimed in claim 2, characterised in that said first division factor is an even number.

4. Local oscillator apparatus as claimed in claim 3, characterised in that said second division factor comprises a factor that is an odd number.

5. Local oscillator apparatus as claimed in claim 3, characterised in that said second division factor is an odd number.

6. Local oscillator apparatus as claimed in claim 2, characterised in that said second division factor comprises a factor that differs by 1 from a factor of said first division factor.

7. Local oscillator apparatus as claimed in claim 2, characterised in that said second division factor differs by 1 from said first division factor.

8. Local oscillator apparatus as claimed in claim 1, characterised in that said communication signal terminals, said controlled frequency oscillator means, said first frequency divider means and said conversion means are included in an integrated circuit and said feedback loop means are separate from said integrated circuit.

9. Local oscillator apparatus as claimed in claim 1, characterised in that said feedback loop means comprises a fractional-number frequency synthesizer arranged to divide said reference frequency in steps that are a multiple of the ratio of said first division factor divided by said second division factor, whereby to change said frequency of said conversion signal in steps equal to the channel spacing of the communication signal.

10. Receiver apparatus comprising local oscillator apparatus as claimed in claim 1, characterised in that said communication signal is received at said communication signal terminals, said conversion means being adapted to combine said communication signal with said conversion signal to produce said base-band signal.

11. Receiver apparatus as claimed in claim 10, characterised in that a low noise amplifier means is connected to said communication signal terminals to receive said communication signal and a transformer is connected between low noise amplifier means and said conversion means, said transformer presenting inductances and internal capacitances to said communication signal such as to form a band-pass filter tuned to the frequency of the communication signal.

12. Transmitter apparatus comprising local oscillator apparatus as claimed in claim 1, characterised in that said communication signal is output at said communication signal terminals, said conversion means being adapted to combine said base-band signal with said conversion signal to produce said communication signal.

13. Terminal apparatus comprising transmitter apparatus as claimed in claim 12, characterised in that said terminal apparatus also includes receiver apparatus capable of receiving signals in accordance with GPS standards, said transmitter apparatus being capable of transmitting a signal in accordance with WBCDMA standards and said first division factor being equal to 3.

* * * * *